(12) United States Patent
Sun (10) Patent No.: US 11,256,893 B2
(45) Date of Patent: Feb. 22, 2022

(54) FINGERPRINT RECOGNITION DEVICE AND MANUFACTURING METHOD THEREOF, DISPLAY PANEL AND MANUFACTURING METHOD THEREOF AND FINGERPRINT RECOGNITION METHOD

(71) Applicant: BOE TECHNOLOGY GROUP CO., LTD., Beijing (CN)

(72) Inventor: Yanliu Sun, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/343,956

(22) PCT Filed: Aug. 27, 2018

(86) PCT No.: PCT/CN2018/102507
§ 371 (c)(1),
(2) Date: Apr. 22, 2019

(87) PCT Pub. No.: WO2019/042252
PCT Pub. Date: Mar. 7, 2019

(65) Prior Publication Data
US 2019/0251326 A1   Aug. 15, 2019

(30) Foreign Application Priority Data
Aug. 28, 2017   (CN) .......................... 201710750277.X (51) Int. Cl.
*G06K 9/00* (2006.01)
*G06K 9/20* (2006.01)
*H01L 27/32* (2006.01)

(52) U.S. Cl.
CPC ....... *G06K 9/0004* (2013.01); *G06K 9/00046* (2013.01); *G06K 9/209* (2013.01); *H01L 27/3227* (2013.01)

(58) Field of Classification Search
None
See application file for complete search history.

(56) References Cited

U.S. PATENT DOCUMENTS

| 2016/0224816 A1* | 8/2016 | Smith | ................ G06K 9/0004 |
| 2018/0068160 A1* | 3/2018 | Wu | ................... G06K 9/2027 |

(Continued)

*Primary Examiner* — Benjamin X Casarez
(74) *Attorney, Agent, or Firm* — Nath, Goldberg & Meyer; Joshua B. Goldberg (57) ABSTRACT

Provided are a fingerprint recognition device and a manufacturing method thereof, a display panel and a manufacturing method thereof, a display device, and a fingerprint recognition method. In the fingerprint recognition device of the present disclosure, the collimator transmits the collimated light reflected by the fingerprint and blocks the scattered light, so that the light emitted by the light emitting layer is reflected by the finger, and the approximately collimated reflected light can transmit through the collimator while the oblique light is blocked by the collimator. The sensor recognizes the ridges and valleys of the fingerprint according to the area through which the light is transmitted by the collimator. The fingerprint recognition device may be manufactured by a simple manufacturing process and have strong practicability, and is suitable for fingerprint collection and recognition in the display area of the organic light emitting diode display.

20 Claims, 5 Drawing Sheets

(56) References Cited

U.S. PATENT DOCUMENTS

| | | | |
|---|---|---|---|
| 2018/0069048 A1* | 3/2018 | Wu | H01L 27/14636 |
| 2018/0120149 A1* | 5/2018 | Chung | A61B 5/1172 |
| 2018/0175125 A1* | 6/2018 | Chung | H01L 27/3234 |
| 2018/0227467 A1* | 8/2018 | Chung | G02B 27/30 |
| 2018/0268190 A1* | 9/2018 | Chung | G06F 3/041 |
| 2018/0270403 A1* | 9/2018 | Chung | H04N 5/2253 |
| 2018/0300525 A1* | 10/2018 | Fourre | G06K 9/0012 |
| 2018/0366593 A1* | 12/2018 | Huang | H01L 27/14623 |
| 2018/0373945 A1* | 12/2018 | Wu | H01L 27/14623 |
| 2019/0050621 A1* | 2/2019 | Xu | G06K 9/0004 |
| 2019/0056613 A1* | 2/2019 | Wang | G02F 1/13338 |
| 2020/0127066 A1* | 4/2020 | Zhang | H01L 51/5275 |
| 2021/0210567 A1* | 7/2021 | Cheng | H01L 27/3234 |

\* cited by examiner

FIG. 11

FINGERPRINT RECOGNITION DEVICE AND MANUFACTURING METHOD THEREOF, DISPLAY PANEL AND MANUFACTURING METHOD THEREOF AND FINGERPRINT RECOGNITION METHOD

CROSS-REFERENCE TO RELATED APPLICATION

This is a National Phase Application filed under 35 U.S.C. 371 as a national stage of PCT/CN2018/102507, filed Aug. 27, 2018, an application claiming the benefit of Chinese Application No. 201710750277.X, filed Aug. 28, 2017, the content of each of which is hereby incorporated by reference in its entirety.

TECHNICAL FIELD

The present disclosure relates to the field of display technology, and in particular, to a fingerprint recognition device and a manufacturing method thereof, a display panel and a manufacturing method thereof, and a fingerprint recognition method.

BACKGROUND

An organic light emitting diode (OLED) display is also known as an organic electroluminesence display (OELD). Among various types of flat panel displays, OLED displays have advantages such as wide viewing angle, high brightness, high contrast, low driving voltage, and fast response.

Fingerprints are inborn and invariable characteristics of a human body, and are unique to everyone and can be used to distinguish from others. Each fingerprint comprises a series of ridges and valleys at skin surface of fingertip, and the ridges and the valleys generally include details of ridge bifurcation, ridge ending, arch (e.g. tented arch), left loop, right loop, whorl or twin loop, etc., these details determine uniqueness of fingerprint. Implementing fingerprint recognition on a display has become an important application.

SUMMARY

An embodiment of the present disclosure provides a fingerprint recognition device including: a light emitting device configured to emit light toward a fingerprint contact side; a collimator provided on a surface of the light emitting device away from the fingerprint contact side and configured to allow a portion of light reflected by a fingerprint to transmit therethrough to obtain collimated light; and a sensor provided on a surface of the collimator away from the light emitting device and configured to receive the collimated light transmitted through the collimator and recognize the fingerprint based on the received collimated light.

In some implementations, the collimator includes a first light blocking layer having a plurality of first openings, a second light blocking layer having a plurality of second openings, and a transparent basic material layer sandwiched between the first light blocking layer and the second light blocking layer, wherein the first openings and the second openings are in one-to-one correspondence.

In some implementations, an orthographic projection of the first opening on the transparent basic material layer falls within an orthographic projection of the second opening corresponding to the first opening on the transparent basic material layer.

In some implementations, the first openings and the second openings are of circular shapes, and a line connecting a center of the first opening and the second opening corresponding to the first opening is perpendicular to the transparent basic material layer.

In some implementations, the first opening has a diameter of d1, the second opening has a diameter of d2, and the transparent basic material layer has a thickness of t, where $d1/t < 1/5$, $d2/t < 1/5$.

In some implementations, d1 ranges from 2 μm to 50 μm, and d2 ranges from 2 μm to 50 μm.

In some implementations, d1 ranges from 2 μm to 20 μm, and d2 ranges from 2 μm to 20 μm.

In some implementations, the second light blocking layer is provided closer to the sensor than the first light blocking layer, a refractive index of a medium between the second light blocking layer and the sensor is n3, a refractive index of the transparent basic material layer is n2, both of a distance between centers of two adjacent second openings and a distance between centers of two adjacent first openings are p, and a gap between fingerprint ridges is pf, where $$t * \tan\left(\arcsin\left(\frac{n_3}{n_2}\right)\right) + d < p < pf/2,$$

and d is any one of d1 and d2.

In some implementations, a medium between the second light blocking layer and the sensor includes air or an adhesive.

In some implementations, the light emitting device includes an organic light emitting diode.

In some implementations, the organic light emitting diode includes a substrate, a cathode and an anode provided above the substrate, and a light emitting layer provided between the cathode and the anode, and the collimator is provided on a surface of the substrate away from the light emitting layer, and the collimator is provided between the substrate and the sensor.

In some implementations, the transparent basic material layer includes PET, COP, PI or thin glass.

An embodiment of the present disclosure provides a display panel including: a display substrate including an organic light emitting diode, the organic light emitting diode is configured to emit light towards a fingerprint contact side; a collimator provided on a surface of the display substrate away from the fingerprint contact side and configured to allow a portion of light reflected by a fingerprint to transmit therethrough to obtain collimated light; and a sensor provided on a surface of the collimator away from the display substrate and configured to receive the collimated light transmitted through the collimator and recognize the fingerprint based on the received collimated light.

In some implementations, the display panel includes a display area and an edge area around the display area, and the collimator and the sensor are provided in the display area.

In some implementations, the display substrate is a transparent display substrate.

An embodiment of the present disclosure provides a display device including the above display panel.

An embodiment of the present disclosure provides a fingerprint recognition method, which is carried out by using the above fingerprint recognition device, the fingerprint recognition method includes the following steps: reflecting, by a fingerprint, light incident onto the fingerprint, so that the reflected light transmits to the collimator; transmitting, by the collimator, collimated light in the reflected light and blocking, by the collimator, scattered light in the reflected light; receiving, by the sensor, the collimated light and recognizing, by the sensor, the fingerprint based on the collimated light.

An embodiment of the present disclosure provides a manufacturing method of the above fingerprint recognition device, including: providing the sensor; forming the collimator above the sensor; and forming the light emitting device above the collimator.

In some implementations, the step of forming the collimator above the sensor includes: forming a first light blocking layer above the sensor and forming an array of first openings in the first light blocking layer by a patterning process; forming a transparent basic material layer above the array of first openings; forming a second light blocking layer above the transparent basic material layer, and forming an array of second openings in the second light blocking layer by a patterning process, wherein the first openings and the second openings are in one-to-one correspondence, and the step of forming the light emitting device above the collimator includes: forming the light emitting device above the array of second openings.

An embodiment of the present disclosure provides a manufacturing method of the above display panel, including: providing the display substrate; forming the collimator on a surface of the display substrate away from a light exiting side thereof; and forming the sensor on a surface of the collimator away from the display substrate.

In some implementations, forming the collimator on a surface of the display substrate away from the light exiting side thereof includes: forming the first light blocking layer on a surface of the display substrate away from the light exiting side thereof, and forming an array of first openings in the first light blocking layer by a patterning process; forming the transparent basic material layer on a surface of the first light blocking layer formed with the array of first openings away from the display substrate; forming the second light blocking layer on a surface of the transparent basic material layer away from the first light blocking layer, and forming an array of second openings in the second light blocking layer by a patterning process, wherein the first openings and the second openings are in one-to-one correspondence, and forming the sensor on a surface of the collimator away from the display substrate includes: forming the sensor on a surface of the second light blocking layer formed with the second openings array away from the display substrate.

DETAILED DESCRIPTION

In order to make a person skilled in the art understand technical solutions of the present application better, the present application will be described in detail below in conjunction with accompanying drawings and embodiments.

The fingerprint recognition device of the OLED display product in the related art is generally provided in a bezel area, resulting in that the fingerprint recognition device occupies space of the bezel area, which is disadvantageous to achieve a narrow bezel design.

Figure 1:
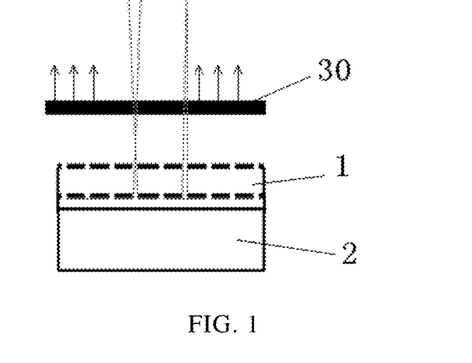
FIG. 1 is a schematic structural diagram of a fingerprint recognition device according to an embodiment of the present disclosure.

An embodiment of the present disclosure provides a fingerprint recognition device, as shown in FIG. 1, the fingerprint recognition device includes a light emitting device 30, a collimator 1 and a sensor 2. The collimator 1 is provided on a surface of the light emitting device 30 away from a fingerprint contact side (i.e., a surface of the light emitting layer 30 of an organic light emitting diode away from a light exiting surface thereof) to allow collimated light in light reflected by a fingerprint to transmit therethrough and block scattered light. The sensor 2 is provided on a surface of the collimator 1 away from the light emitting device 30, and configured to receive the collimated light transmitted through the collimator 1 and recognize the fingerprint according to the collimated light.

In the fingerprint recognition device of the present embodiment, the collimator 1 transmits the collimated light reflected by the fingerprint and blocks the scattered light, so that after the light emitted by the light emitting layer 30 of the organic light emitting diode is reflected by the finger, approximately collimated light may transmit through the collimator while the oblique light is blocked by the collimator 1. The sensor 2 recognizes the ridges and valleys of the fingerprint based on the light transmitted by the collimator 1. The fingerprint recognition device may be manufactured by a simple manufacturing process and has a strong practicability, and is suitable for fingerprint collection and recognition in the display area of the organic light emitting diode display, and since the collimator is provided, only the collimated light can transmit therethrough, thereby reducing the interference of the scattered light, improving the fingerprint detection accuracy.

Figure 2:
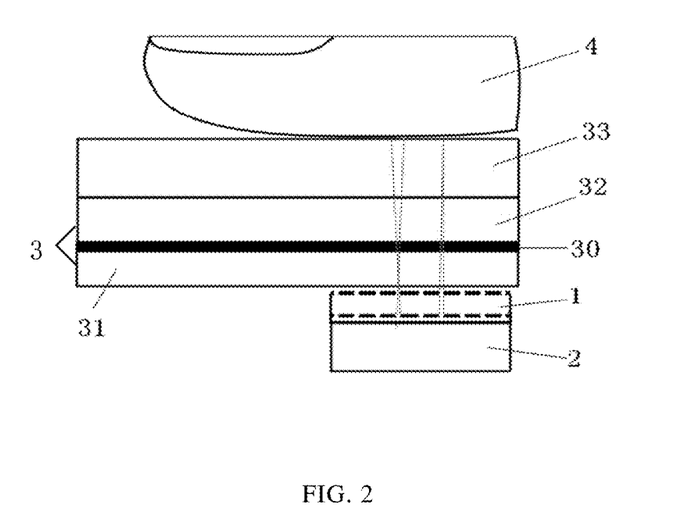
FIG. 2 through FIG. 6 are schematic structural diagrams of a fingerprint recognition device according to an embodiment of the present disclosure.

An embodiment of the present disclosure provides a fingerprint recognition device, as shown in FIG. 2, the fingerprint recognition device includes an organic light emitting diode 3, a collimator 1 and a sensor 2; wherein the collimator 1 is provided on a surface of the light emitting layer 30 of the organic light emitting diode 3 away from the light exiting surface, to allow collimated light in light reflected by the fingerprint to transmit therethrough, and blocks the scattered light. The sensor 2 is provided on a surface of the collimator 1 away from the light emitting layer 30, and configured to receive the collimated light from the collimator 1 and recognizes the fingerprint based on the received collimated light. The collimator 1 of the present embodiment includes a first light blocking layer 11 having a plurality of first openings 14, a second light blocking layer 12 having a plurality of second openings 15, and a transparent basic material layer 13 sandwiched between the first light blocking layer 11 and the second light blocking layer 12, wherein the first openings 14 are in one-to-one correspondence with the second openings 15.

Figure 3:
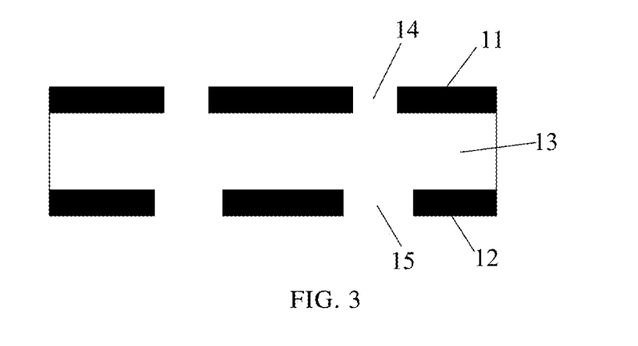

FIG. 2 is a schematic structural diagram of a fingerprint recognition device of the present embodiment, and FIG. 3 is a partially enlarged view of the collimator 1. FIG. 2 shows the sensor 2 provided at the bottom, the collimator 1 provided on the sensor 2, and the substrate 31, the light emitting layer 30, the encapsulation layer 32 and the cover layer 33 provided above the collimator 1, and the finger 4. As can be seen from FIG. 2, the light emitting layer 30 emits light, and the light transmits through the sequentially stacked encapsulation layer 32 and the cover layer 33, and is irradiated onto the ridges or valleys of the fingerprint of the finger 4, the fingerprint of the finger 4 reflects the light back, the reflected light transmits through the cover layer 33, the encapsulation layer 32, the light emitting layer 30 and the substrate 31 to reach the collimator 1, and is modulated and selected by the collimator 1, then the collimated light having an incident angle within a corresponding range transmits to the sensor 2, and the sensor 2 recognizes the ridges and valleys of the fingerprint based on the light transmitted by the collimator 1.

As an implementation of the present embodiment, an orthographic projection of the first opening 14 on the transparent basic material layer 13 falls within a range of an orthographic projection of the second opening 15 corresponding to the first opening 14 on the transparent basic material layer 13.

Figure 4:
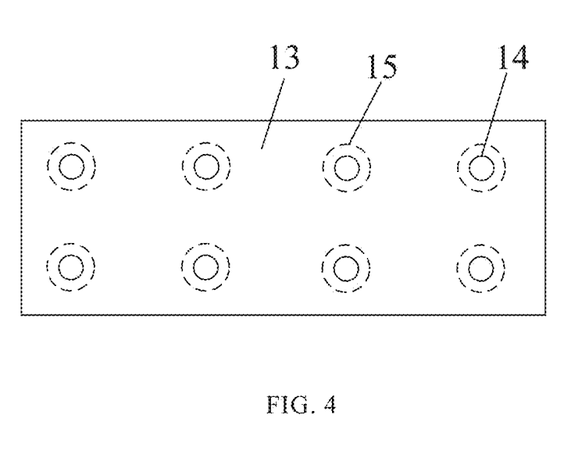

FIG. 4 is a perspective view of the collimator 1. As can be seen from FIGS. 3 and 4, dimensions of the first opening 14 and the second opening 15 may be different. The dimensions of these openings may be adjusted according to requirements of actual products.

As an implementation of the present embodiment, the first openings 14 and the second openings 15 are of circular shapes and have the same dimensions, and a connection line connecting a center of the first opening 14 with a center of the second opening 15 corresponding to the first opening 14 is perpendicular to the transparent basic material layer 13.

That is to say, in the present embodiment, a case where the first opening 14 and the second opening 15 are the same in dimensions and shapes, and the centers of the first opening 14 and the second opening 15 directly face each other is described as an example. The connection line connecting the center of the first opening 14 with the center of the second opening 15 is an axis (also referred to as a central axis). Generally, the light parallel to the central axis is a paraxial light. If the light has a large angle with respect to the central axis, it is non-paraxial light. For example, light with an angle of 10 degrees or less with respect to the central axis is called paraxial light, while light with an angle greater than 10 degrees with respect to the central axis is called non-paraxial light. In the present disclosure, the paraxial light is considered to be the collimated light.

Figure 5:
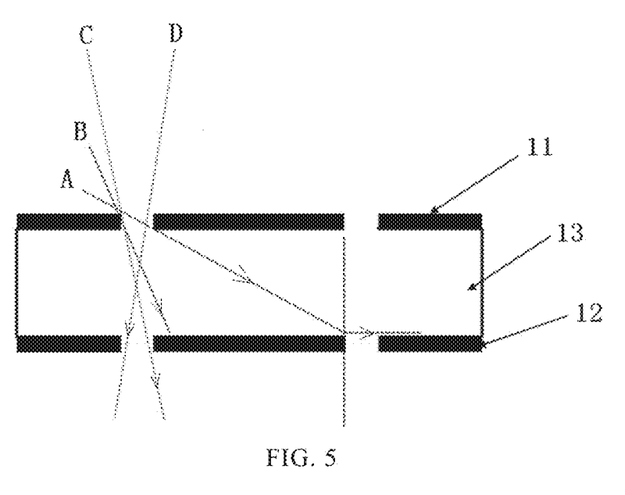

Referring to FIG. 5, the light reflected by the finger is in a scattering state, wherein the collimated light C and D can transmit through the collimator 1 to reach the surface of the sensor 2, and the light B with a relatively large angle will be blocked by the first light blocking layer 11 and the second light blocking layer 12, and the light A with a larger angle is totally reflected on a lower surface of the transparent basic material layer 13 and cannot transmit through the transparent basic material layer 13, thus the first openings 14 and the second openings 15 serve to ensure that the useful collimated light can transmit therethrough.

As an implementation of the present embodiment, the second light blocking layer 12 is provided closer to the sensor 2 than the first light blocking layer 11. A refractive index of a medium between the second light blocking layer 12 and the sensor 2 is n3, a refractive index of the transparent basic material layer is n2, a distance between the centers of two adjacent second openings 15 is p, a diameter of the second opening 15 is d, and a pitch of the fingerprint ridges is pf, where $$t*\tan\left(\arcsin\left(\frac{n_3}{n_2}\right)\right)+d<p<pf/2.$$

Similarly, for the first light blocking layer 11, the above formula is also satisfied, and will not be described herein.

Figure 6:
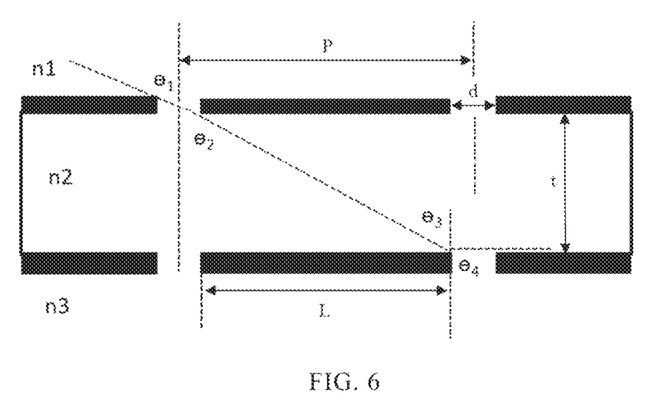

Further, as shown in FIG. 6, the light entering the transparent basic material layer 13 has an incident angle of $\theta_1$ and a refractive angle of $\theta_2$, where $\theta_2=\arcsin(n_1 \times \sin \theta_1/n_2)$, and the light on the lower surface of the transparent basic material layer 13 has an incident angle of $\theta_3$, where $$\theta_3=\theta_2=\arcsin(n1 \times \sin \theta_1/n2) \qquad (1),$$

Since an interface between the second light blocking layer 12 and the sensor 2 is usually formed of air or a medium with low refractive index, as long as it is satisfied that the $\theta_3$ is larger than the total reflective angle, that is, $$\theta_3 > \arcsin\left(\frac{n_3}{n_2}\right), \qquad (2)$$

the light would be confined in the transparent basic material layer 13 without reaching the sensor 2, so that interference of scattered light would not occur.

According to the above formulas (1) and (2), it can be obtained that the incident angle $\theta_1$ satisfies the following formula (3):

$$\theta_1 > \arcsin\left(\frac{n_3}{n_1}\right). \qquad (3)$$

From the above, it can be seen that the light incident from the first light blocking layer into the transparent basic material layer satisfying the incident angle of $\theta_1$ in the formula (3) is incident, at an incident angle of θ3 satisfying the formula (2), at the lower surface of transparent basic material layer, thereby a total reflection occurs, so that the light cannot transmit through the transparent basic material layer.

Further, as can be seen from the above, according to the critical angle of $\theta_3$ of a total reflection, a distance L between two adjacent openings of the second light blocking layer may satisfy:

$$L > t*\tan\left(\arcsin\left(\frac{n_3}{n_2}\right)\right), \qquad (4)$$

where t is a thickness of the transparent basic material layer 13.

In other words, as long as the width L between two adjacent openings of the second light blocking layer is designed to satisfy the formula (4), it is possible to cause the incident light with the incident angle of $\theta_1$ to be total reflected at the interface of the second light blocking layer without transmitting through the transparent basic material layer.

Further, as can be seen from FIG. 6, each of the first openings 14 and the second openings 15 at the upper and lower surfaces of the transparent basic material layer 13 satisfies the following formula (5):

$$p > t*\tan\left(\arcsin\left(\frac{n_3}{n_2}\right)\right) + d, \quad (5)$$

where p is a pitch between centers of two adjacent openings.

In summary, in the present embodiment, assuming that the incident angle of the light allowed to be transmitted through the collimator 1 is $\theta_0$, the incident light can transmit through the collimator 1 when its incident angle $\theta \leq \theta_0$, and the incident light would be blocked by the light blocking layer when its incident angle $\theta$ satisfies that $$\theta_0 < \theta < \arcsin\left(\frac{n_3}{n_1}\right),$$

the incident light is totally reflected by the transparent basic material layer so as to be absorbed by the transparent basic material layer when its incident angle satisfies $$\theta \geq \arcsin\left(\frac{n_3}{n_1}\right),$$

where $\theta_0$ may be obtained according to the following formula:

$$\sin\theta_0 \times n_1 = \sin\theta_2 \times n_2$$

$$\tan\theta_2 = (d/2)/t$$

According to the above derivation, the critical angle of $\theta_0$ may be:

$$\arcsin\left\{\frac{n_2}{n_1} \times \left[\arcsin\left(\arctan\frac{d}{2t}\right)\right]\right\}.$$

Figure 7:
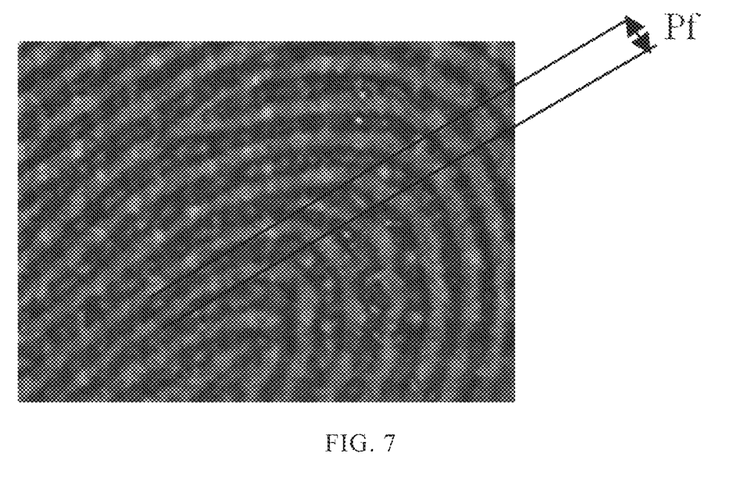
FIG. 7 is a schematic diagram of a fingerprint according to an embodiment of the present disclosure.

In addition, in order to improve the accuracy of fingerprint recognition, the pitch p between the centers of two adjacent openings should be smaller than the pitch pf between adjacent ridges of the fingerprint (see FIG. 7), preferably smaller than half of the pitch between adjacent ridges, that is, $$t*\tan\left(\arcsin\left(\frac{n_3}{n_2}\right)\right) + d < p < pf/2.$$

In some embodiments, the medium between the second light blocking layer 12 and the sensor includes air or an adhesive.

That is to say, the second light blocking layer 12 and the sensor may be bonded by the adhesive, and the refractive index of the adhesive is n3.

In some embodiments, the transparent basic material layer may be formed from PET (polyethylene terephthalate), COP (Cyclo olefin polymer), PI (Polyimide), or thin glass.

As an implementation of the present embodiment, air may be provided between the second light blocking layer 12 and the sensor, that is, only the second light blocking layer is bonded to the sensor at edges, and in-plane medium between the second light blocking layer 12 and the central portion of the sensor is air. The effect of such design is to enhance the intensity of the collimated light received by the collimator, further improving the efficiency and accuracy of fingerprint recognition by the sensor.

In some implementations, a dimension of the first opening 14 (the diameter of the first opening 14) is d1, and a dimension of the second opening 15 (the diameter of the second opening 15) is d2, a thickness of the transparent basic material layer 13 is t, where d1/t<⅕, d2/t<⅕.

In some implementations, the d1 ranges from 2 µm to 50 µm; the d2 ranges from 2 µm to 50 µm.

In some implementations, the d1 ranges from 2 µm to 20 µm; the d2 ranges from 2 µm to 20 µm.

That is to say, in order to ensure that the transmitted light is approximately collimated light, the diameter d of the first opening 14 and the second opening 15 should be much smaller than the thickness t of the basic material layer, that is, d/t<⅕, for example, ¹⁄₁₀<d/t<¹⁄₁₅, such that the light with the incident angle less than 10° can transmit through the collimator 1, where the diameter d1 of the first opening 14 and the diameter d2 of the second opening 15 (where d1 and d2 are collectively referred to as d) may be in a range from 2 µm to 50 µm, for example, in a range from 5 µm to 20 µm.

Figure 8:
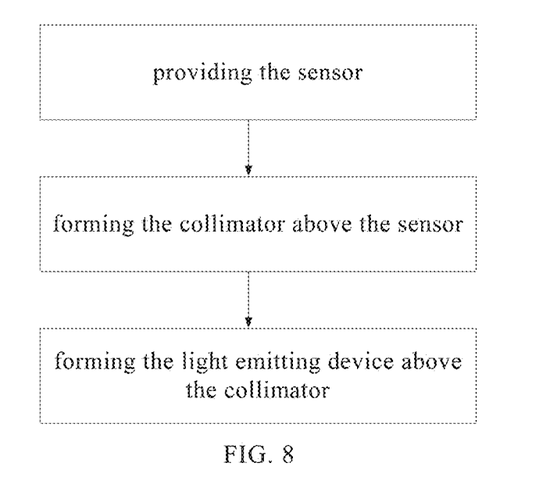
FIG. 8 is a flowchart of a manufacturing method of a fingerprint recognition device according to an embodiment of the present disclosure.

An embodiment of the present disclosure further provides a manufacturing method of the above-described fingerprint recognition device, as shown in FIG. 8, including the steps of: providing the sensor 2; forming the collimator 1 above the sensor 2; and forming the light emitting diode 30 above the collimator.

More specifically, the step of forming the collimator above the sensor 2 includes: forming a second light blocking layer 12 above the sensor 2, and forming an array of second openings in the second light blocking layer 12 by using a patterning process; forming the transparent basic material layer 13 above the array of the second openings 15; forming the first light blocking layer 11 above the transparent basic material layer 13 and forming an array of first openings in the first light blocking layer 11 by using a patterning process, wherein the first openings 14 are in one-to-one correspondence with the second openings 15.

Furthermore, the step of forming the organic light emitting diode above the collimator 2 includes: forming the organic light emitting diode above the array of second openings.

The organic light emitting diode in the present embodiment is formed by a conventional method, and details thereof are not described herein again.

Figure 9:
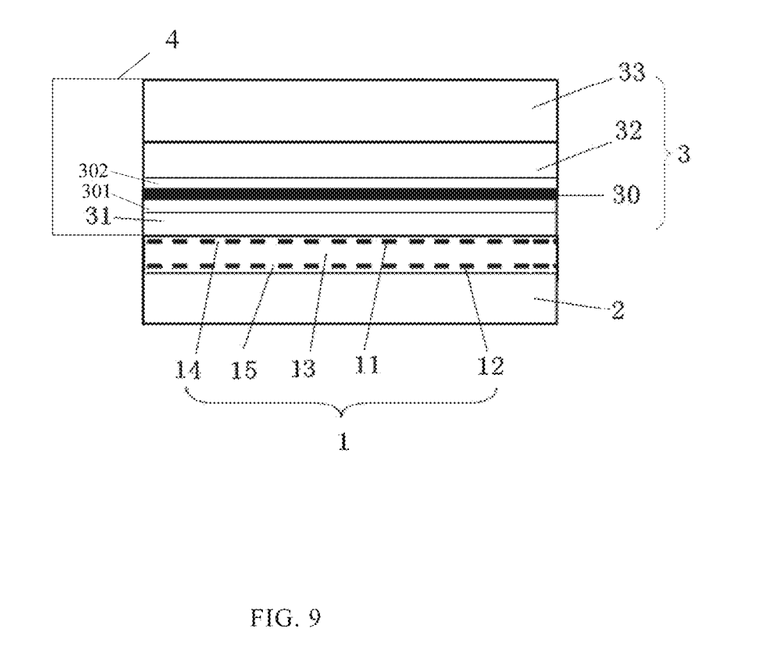
FIG. 9 is a schematic structural diagram of a display panel according to an embodiment of the present disclosure.

An embodiment of the present disclosure provides a display panel. As shown in FIG. 9, the display panel includes: a display substrate 4 including an organic light emitting diode 3, the organic light emitting diode 3 is configured to emit light toward a fingerprint contact side; a collimator 1 provided on a surface of the display substrate away from the fingerprint contact side and configured to transmit collimated light reflected by a fingerprint therethrough; a sensor 2 provided on a surface of the collimator away from the display substrate 4 and configured to receive the collimated light transmitted through the collimator and recognize the fingerprint according to the received collimated light.

As an implementation in the present embodiment, the organic light emitting diode 3 for fingerprint recognition is realized by an organic light emitting diode for display in a display panel. Further, the organic light emitting diode 3 may include a cathode 301, an anode 302, and a light emitting layer 30 provided between the cathode and the anode. In addition, a hole injection layer (HIL), a hole transport layer (HTL), an electron transport layer (ETL), and an electron injection layer (EIL) may be further provided between the cathode and the anode.

In the present embodiment, the collimator 1 includes the first light blocking layer 11 having a plurality of first openings 14, the second light blocking layer 12 having a plurality of second openings 15, and the transparent basic material layer 13 provided between the first light blocking layer 11 and the second light blocking layer 12; wherein the first openings 14 are in one-to-one correspondence with the second openings 15. The first light blocking layer 11 is provided immediately adjacent to the lower surface of the display substrate, and the second light blocking layer 12 is provided proximal to the sensor 2. The collimator and the sensor may be formed as one separate device in advance and then bonded onto the lower surface of the display substrate; or the collimator 1 and the sensor 2 may be formed directly on the lower surface of the display substrate during the process of manufacturing the display panel, thereby forming an integrated structure.

As an implementation of the present embodiment, the display panel includes a display area and an edge area around the display area, and the fingerprint recognition structure is provided in the display area. In this case, since the organic light emitting diode for display in the display panel is used for fingerprint recognition, it is required that each of the layer structures of the display substrate is made of a transparent material to ensure that light reflected by the finger can be incident onto the sensor 2 for performing fingerprint recognition.

That is to say, the display panel of the present embodiment can perform fingerprint collection and recognition in the display area, simplifying the manufacturing process, reducing the bezel area of the entire OLED display, thus can achieve a narrow bezel or a bezel-less design.

Figure 10:
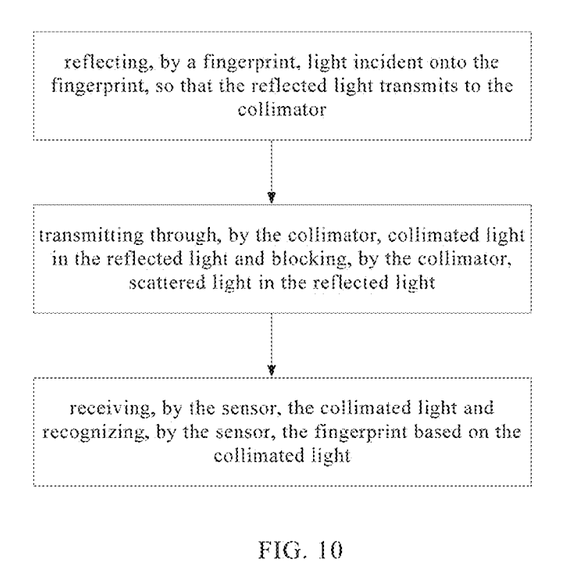
FIG. 10 is a flowchart of a fingerprint recognition method according to an embodiment of the present disclosure.

An embodiment of the present disclosure provides a fingerprint recognition method, which uses the fingerprint recognition device of the above embodiment to perform fingerprint recognition. As shown in FIG. 10, the fingerprint recognition method includes the following steps: S01, by the fingerprint, reflecting the light irradiated onto the fingerprint to allow the reflected light to transmit to the collimator; S02, by the collimator, transmitting collimated light in the reflected light, and blocking the scattered light in the reflected light; S03, by the sensor, receiving the collimated light and recognizing the fingerprint based on the collimated light.

In the fingerprint recognition method of the present embodiment, the light emitted by the light emitting layer is reflected by the finger, and the approximately collimated reflected light can transmit through the collimator, and the oblique light is blocked by the collimator. The sensor recognizes the ridges and valleys of the fingerprint based on the light transmitted through the collimator. The manufacturing method is simple in design and strong in practicability, and is suitable for fingerprint collection and recognition in the display area of the organic light emitting diode display.

Figure 11:
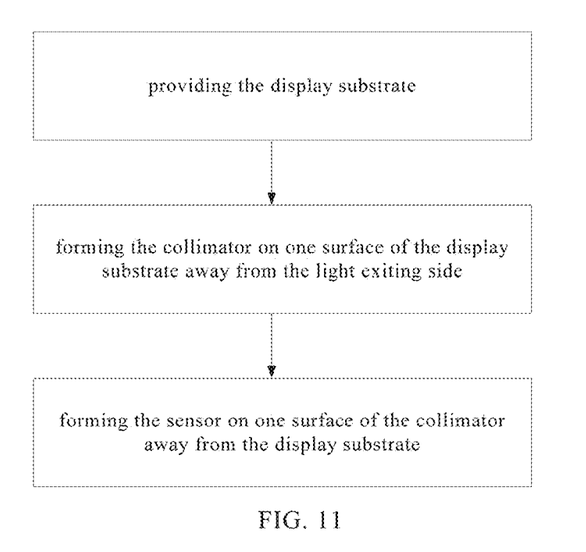
FIG. 11 is a flowchart of a manufacturing method of a display panel according to an embodiment of the present disclosure.

An embodiment of the present disclosure provides a manufacturing method of the display panel in the above embodiment. As shown in FIG. 11, the manufacturing method includes the following steps: providing a display substrate 4 including an organic light emitting diode 3 that emits light toward a fingerprint contact side; forming the collimator 1 on a surface of the display substrate 4 away from the light exiting side thereof; and forming the sensor 2 on a surface of the collimator 1 away from the display substrate.

Obviously, the specific implementations of the above embodiments may also be varied in many ways, for example, the specific thickness of each of the layer structures may be adjusted according to product requirements, and the specific dimensions of each component may be varied according to actual conditions. For example, in the above manufacturing method of the display panel, the collimator and the sensor may be previously formed as one separate device, and then the device is bonded to the lower surface of the display substrate during the manufacturing process to form a display panel having a fingerprint recognition function.

An embodiment of the present disclosure provides a display device including any of the above display panels. The display device may be any product or part having a display function, such as an electronic paper, a mobile phone, a tablet computer, a television, a display, a notebook computer, a digital photo frame, a navigator, and the like.

It should be understood that, the above embodiments are merely exemplary embodiments for explaining principle of the present invention, but the present invention is not limited thereto. Various modifications and improvements may be made by those ordinary skilled in the art within the spirit and essence of the present invention, these modifications and improvements fall into the protection scope of the present invention.

What is claimed is:

1. A fingerprint recognition device, comprising:
a light emitting device configured to emit light toward a fingerprint contact side;
a collimator provided on a surface of the light emitting device away from the fingerprint contact side and configured to allow a portion of light reflected by a fingerprint to transmit therethrough to obtain collimated light; and
a sensor provided on a surface of the collimator away from the light emitting device and configured to receive the collimated light transmitted through the collimator and recognize the fingerprint based on the received collimated light,
wherein the collimator comprises a first light blocking layer having a plurality of first openings, a second light blocking layer having a plurality of second openings, and a transparent basic material layer sandwiched between the first light blocking layer and the second light blocking layer, wherein the first openings and the second openings are in one-to-one correspondence,
wherein the first openings have a diameter of d1, the second openings have a diameter of d2, and the transparent basic material layer has a thickness of t, where $d1/t < 1/5$, $d2/t < 1/5$, and
wherein the second light blocking layer is provided closer to the sensor than the first light blocking layer, a refractive index of a medium between the second light blocking layer and the sensor and provided at a side of the second light blocking layer distal to the transparent basic material layer is n3, a refractive index of the transparent basic material layer is n2, both of a distance between centers of two adjacent second openings and a distance between centers of two adjacent first openings are p, and a gap between fingerprint ridges is pf, wherein $$t*\tan\left(\arcsin\left(\frac{n_3}{n_2}\right)\right)+d<p<pf/2,$$

and d is any one of d1 and d2.

2. A fingerprinting recognition device according to claim 1, wherein an orthographic projection of the first openings on the transparent basic material layer falls within an orthographic projection of the second openings corresponding to the first openings on the transparent basic material layer.

3. The fingerprint recognition device according to claim 2, wherein the first openings and the second openings are of circular shapes, and a connection line connecting a center of each of the first openings and each of the second openings corresponding to the first openings is perpendicular to the transparent basic material layer.

4. The fingerprint recognition device according to claim 1, wherein d1 ranges from 2 µm to 50 µm, and d2 ranges from 2 µm to 5 µm.

5. The fingerprint recognition device according to claim 1, wherein the medium between the second light blocking layer and the sensor comprises an adhesive; and
the second light blocking layer and the sensor are bonded by the adhesive, and the refractive index of the adhesive is n3.

6. The fingerprint recognition device according to claim 1, wherein the light emitting device comprises an organic light emitting diode.

7. The fingerprint recognition device according to claim 6, wherein the organic light emitting diode comprises a substrate, a cathode, an anode provided above the substrate, and a light emitting layer provided between the cathode and the anode, wherein
the collimator is provided on a surface of the substrate away from the light emitting layer, and the collimator is provided between the substrate and the sensor.

8. The fingerprint recognition device according to claim 1, wherein the transparent basic material layer comprises polyethylene terephthalate, cyclo olefin polymer, polyimide or thin glass.

9. A fingerprint recognition method, which is carried out by using the fingerprint recognition device according to claim 1, the fingerprint recognition method comprises the following steps:
reflecting, by a fingerprint, light incident onto the fingerprint, so that the reflected light transmits to the collimator;
transmitting, by the collimator, collimated light in the reflected light and blocking, by the collimator, scattered light in the reflected light;
receiving, by the sensor, the collimated light and recognizing, by the sensor, the fingerprint based on the collimated light.

10. A manufacturing method of the fingerprint recognition device of claim 1, comprising:
providing the sensor;
forming the collimator above the sensor; and
forming the light emitting device above the collimator.

11. The manufacturing method according to claim 10, wherein the step of forming the collimator above the sensor comprises:
forming the first light blocking layer above the sensor and forming an array of the first openings in the first light blocking layer by a patterning process;
forming the transparent basic material layer above the array of first openings;
forming the second light blocking layer above the transparent basic material layer, and forming an array of the second openings in the second light blocking layer by a patterning process, wherein
the first openings and the second openings are in one-to-one correspondence, and
the step of forming the light emitting device above the collimator comprises:
forming the light emitting device above the array of second openings.

12. The fingerprint recognition device according to claim 1, wherein the medium between the second light blocking layer and the sensor comprises air; and
the second light blocking layer is bonded to the sensor at edges, and in-plane medium between the second light blocking layer and a central portion of the sensor is air, and the refractive index of the air is n3.

13. A display panel comprising:
a display substrate including an organic light emitting diode, the organic light emitting diode is configured to emit light towards a fingerprint contact side;
a collimator provided on a surface of the display substrate away from the fingerprint contact side and configured to allow a portion of light reflected by a fingerprint to transmit therethrough to obtain collimated light; and
a sensor provided on a surface of the collimator away from the display substrate and configured to receive the collimated light transmitted through the collimator and recognize the fingerprint based on the received collimated light,
wherein the collimator comprises a first light blocking layer having a plurality of first openings, a second light blocking layer having a plurality of second openings, and a transparent basic material layer sandwiched between the first light blocking layer and the second light blocking layer, wherein the first openings and the second openings are in one-to-one correspondence,
wherein the first openings have a diameter of d1, the second openings have a diameter of d2, and the transparent basic material layer has a thickness of t, where d1/t<⅕, d2/t<⅕, and
wherein the second light blocking layer is provided closer to the sensor than the first light blocking layer, a refractive index of a medium between the second light blocking layer and the sensor and provided at a side of the second light blocking layer distal to transparent basic material layer is n3, a refractive index of the transparent basic material layer is n2, both of a distance between centers of two adjacent second openings and a distance between centers of two adjacent first openings are p, and a gap between fingerprint ridges is pf, wherein $$t*\tan\left(\arcsin\left(\frac{n_3}{n_2}\right)\right)+d<p<pf/2,$$

and d is any one of d1 and d2.

14. The display panel according to claim 13, wherein the display panel includes a display area and an edge area around the display area, and the collimator and the sensor are provided in the display area.

15. The display panel according to claim 14, wherein the display substrate is a transparent display substrate.

16. A display device comprising the display panel according to claim 14.

17. A manufacturing method of the display panel of claim 13 comprising:
providing the display substrate;
forming the collimator on a surface of the display substrate away from a light exiting side thereof; and
forming the sensor on a surface of the collimator away from the display substrate.

18. The manufacturing method according to claim 17, wherein forming the collimator on a surface of the display substrate away from the light exiting side thereof comprises:
forming the first light blocking layer on a surface of the display substrate away from the light exiting side thereof, and forming an array of first openings in the first light blocking layer by a patterning process;
forming the transparent basic material layer on a surface of the first light blocking layer formed with the array of first openings away from the display substrate;
forming the second light blocking layer on a surface of the transparent basic material layer away from the first light blocking layer, and forming an array of second openings in the second light blocking layer by a patterning process, wherein
the first openings and the second openings are in one-to-one correspondence, and
forming the sensor on a surface of the collimator away from the display substrate comprises:
forming the sensor on a surface of the second light blocking layer formed with the array of second openings away from the display substrate.

19. The display panel according to claim 13, wherein the medium between the second light blocking layer and the sensor comprises an adhesive; and
the second light blocking layer and the sensor are bonded by the adhesive, and the refractive index of the adhesive is n3.

20. The display panel according to claim 13, wherein the medium between the second light blocking layer and the sensor comprises air; and
the second light blocking layer is bonded to the sensor at edges, and in-plane medium between the second light blocking layer and a central portion of the sensor is air, and the refractive index of the air is n3.

* * * * *